United States Patent [19]

Matsukawa

[11] Patent Number: 4,794,305
[45] Date of Patent: Dec. 27, 1988

[54] SUBSTRATE SUPPORT STRUCTURE FOR ION IMPLANTATION DEVICE

[75] Inventor: Takayuki Matsukawa, Hyogo, Japan

[73] Assignee: Mitsubishi Denki Kabushiki Kaisha, Tokyo, Japan

[21] Appl. No.: 54,765

[22] Filed: May 27, 1987

[30] Foreign Application Priority Data

May 29, 1986 [JP] Japan ................ 61-126763

[51] Int. Cl.$^4$ .................................... H01L 21/265
[52] U.S. Cl. ................... 315/111.81; 250/398;
250/442.1; 250/494.1; 250/492.2; 250/492.3;
313/359.1
[58] Field of Search ............... 250/440.1, 441.1, 442.1,
250/443.1, 423 R, 423 F, 492.1, 492.2, 492.3,
491.1, 398; 315/111.81, 111.41; 313/359.1

[56] References Cited

U.S. PATENT DOCUMENTS 4,508,056 4/1985 Bruel et al. ............... 250/442.1

FOREIGN PATENT DOCUMENTS

| 0217361 | 4/1987 | European Pat. Off. ....... 315/111.81 |
| 0128555 | 10/1981 | Japan ............................... 315/111.81 |
| 1490481 | 11/1977 | United Kingdom ............ 250/492 R |
| 1540751 | 2/1979 | United Kingdom ............ 250/492 R |
| 2087766 | 6/1982 | United Kingdom ............ 250/492 R |
| 2168080 | 6/1986 | United Kingdom ............ 250/492 R |

OTHER PUBLICATIONS

Wilson, Robert E. et al., "Ion Beams with Applications to Ion Implantation", A Wiley Interscience Publication, John Wiley & Sons, New York, 1973.

Primary Examiner—David K. Moore
Assistant Examiner—Mark R. Powell
Attorney, Agent, or Firm—Lowe, Price, LeBlanc, Becker & Shur

[57] ABSTRACT

A substrate support structure for an ion implantation device comprises a plurality of substrate holders supporting sample substrates so that each sample substrate can be rotated around an axis perpendicular to its main surface and so that the angle of inclination of said main surface with respect to ion beams can be changed, a rotary drive for rotatively driving the sample substrates, an inclination angle adjuster for changing the angle of inclination of the sample substrate with respect to ion beams, and a rotary disk rotatably installed and supporting the plurality of substrate holders on the same circumference with the center at its rotary axis.

10 Claims, 5 Drawing Sheets

SUBSTRATE SUPPORT STRUCTURE FOR ION IMPLANTATION DEVICE

BACKGROUND OF THE INVENTION

1. Field of the Invention

This invention relates to a substrate support structure for an ion implantation device for supporting a substrate to be implanted with ions. Such a substrate support structure is used, for example, for production of semiconductor devices.

2. Description of the Prior Art

FIGS. 9 and 10 are schematic views of an ion implantation device such as one shown in page 457, Chap. 5 of "Ion Beams: with Applications to Ion Implantation" by R. G. Wilson and G. R. Brewer, published by J. John Wiley & Sons (1973). Semiconductor substrates 3 of silicon or the like to be implanted with ions by ion beams 1 are placed on a rotary disk 2. As shown, these semiconductor substrates 3 are arranged on the same circumference with the center at the rotary axis 5 of the rotary disk 2. Further, as shown in FIG. 10, each semiconductor substrate 3 is formed with grooves on its main surface.

The holding of the semiconductor substrates 3 on the rotary disk 2 is effected by a mechanical hold means (not shown) or by centrifugal force produced during rotation of the rotary disk 2.

The semiconductor substrates 3 arranged in the manner described above are irradiated with ion beams 3 and thereby implanted with ions of an impurity by an amount needed for production of semiconductor devices. The ion beams 1 usually have an acceleration energy of several tens KeV and their current value is at least several milliamperes. Therefore, if ion beams are directed continuously to a particular substrate, the amount of heat generated in the substrate would be too large. For this reason, the rotary disk 2 is rotated at a constant angular velocity $\omega$ so that individual semiconductor substrates are intermittently irradiated with ion beams. Thereby, the semiconductor substrates 3 are protected from being overheated.

It has been common practice to arrange the incidence of ion beams 1 to the semiconductor substrates 3 so that the ion beams are not perpendicular to the substrates in order to avoid the ion channeling phenomenon; they are inclined by about 10° with respect to an axis perpendicular to the main surface of the semiconductor substrate 3, as shown by $\theta$ in FIG. 9.

However, in the case of the construction of the semiconductor substrates 3 having grooves 4 as shown in FIG. 10, the following problem arises.

The ion beams 1 are radiated also into the grooves. However, in the case where each groove is a rectangular parallelepiped defined by four lateral walls, all the lateral walls are not uniformly implanted with ions. More particularly, as shown in FIG. 10, the lateral wall disposed on one side is implanted with ions but the other lateral walls, i.e., those which are shadowed by the opening in the groove 4, are not implanted with ions. In FIG. 10, the regions 6 which are shadowed by the openings in the grooves 4 are shaded.

SUMMARY OF THE INVENTION

It is an object of this invention to provide a substrate support structure for an ion implantation device for supporting a substrate to be implanted with ions, which comprises the following:

a. a plurality of substrate holders supporting sample substrates so that each sample substrate can be rotated rround an axis perpendicular to its main surface and so that the angle of inclination of said main surface with respect to ion beams can be changed, b. rotary drive means for rotatively driving said sample substrates, c. inclination angle adjusting means for changing the angle of inclination of said sample substrates with respect to beams, and d. a rotary disk rotatably installed and supporting said plurality of substrate holders on the same circumference with the center at its rotary axis.

The angle of rotation and the angle of inclination of the sample substrate are determined so that they correspond to the shape of the grooves formed on the main surfaces of the sample substrates.

More particularly, first, ions are implanted into a first lateral wall. When fixed amount of ions implanted is reached, the sample substrate is rotated around an axis perpendicular to its main surface and the angle of inclination with respect to ion beams is changed so that the next lateral wall can be irradiated with ion beams. Ion beams are radiated to this lateral wall until the fixed amount of ions is reached. In this manner, the same operation is performed on all the lateral walls, whereby the lateral walls defining the groove are uniformly implanted with ion.

As described above, according to the invention, sample substrates are arranged so that they can be rotated around their respective axes and so that the angle of inclination of the main surfaces with respect to ion beams can be changed; thus, the lateral walls of the grooves formed on the main surface of each sample substrate can be uniformly and quickly implanted with ions.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
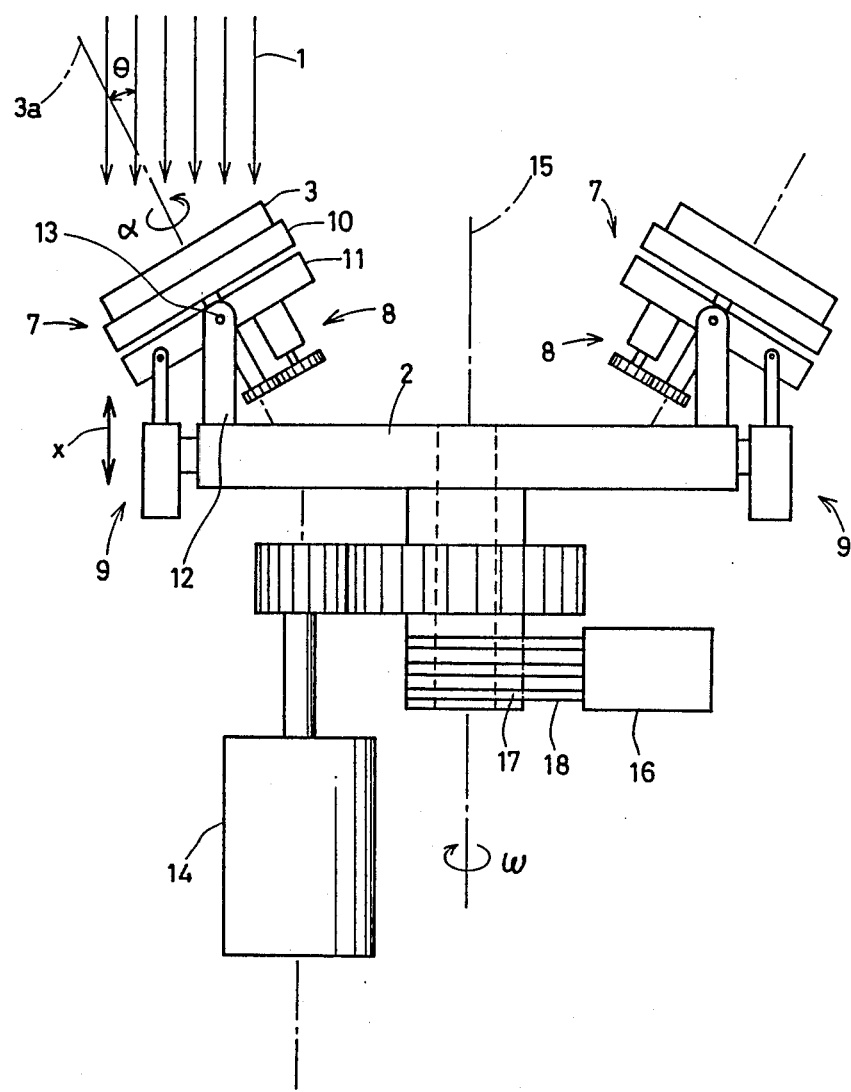
FIG. 1 is a schematic view showing an embodiment of the invention.

FIG. 1 shows an embodiment of the invention. The illustrated substrate support structure for an ion implantation device comprises substrate holders 7 for supporting sample substrates 3 which are, for example, semiconductor substrates, rotary drive means 8, inclination angle adjusting means 9 and a rotary disk 2.

Each substrate holder 7 supports a sample substrate 3 so that it can be rotated around an axis 3a perpendicular to its main surface and so that the angle of inclination of said main surface with respect to ion beams 1 can be changed. More particularly, the substrate holder 7 includes a substrate block 10 for fixedly supporting the sample substrate, and a support plate 11 for rotatably supporting the sample substrate. The support plate 11 is attached by a shaft to a pillar 12 fixedly installed on the rotary disk 2 so that the angle of inclination of the support plate 11 can be changed.

The rotary drive means 8 serves to rotatively drive the sample substrate 3. In this embodiment, a pulse motor is used as the rotary drive means 8. The pulse motor 8 is mounted on the support plate 11 and rotatively drives the substrate block 10 through a gear train. The inclination angle adjusting means 9 serves to change the angle of inclination of the sample substrate 3 with respect to ion beams 1. In this embodiment, a pulse motor is used as the inclination angle adjusting means 9 and acts to change the angle of inclination of the sample substrate by vertically moving one end of the support plate 11 as indicated by arrows X.

The rotary disk 2 is rotated at an angular velocity $\omega$ by a motor 14. The substrate holders 7 are mounted on the rotary disk 2 so that they are disposed on the same circumference with the center at the rotary axis 15 of the rotary disk 2.

To actuate the rotary drive means 8 and inclination angle adjusting means 9, it is necessary to feed some kind of control signals and energy from the rotation system for the rotary disk 2. In this embodiment, control signals and energy are supplied from brush electrodes 17 installed on the rotary shaft of the rotary disk 2 and external brush electrodes 18 in contact with said brush electrodes 17. In this case, a signal for controlling the rotative angle $\alpha$ of the sample substrate 3 and a signal for controlling the angle of the inclination 8 of the sample substrate 3 are supplied from a control box 16.

The case of implanting sample substrates with ions having grooves on their main surfaces by the use of the device shown in FIG. 1 will now be considered. When the sample substrate 3 is rotated around an axis perpendicular to its main surface continuously at an angular velocity $\omega$, the amount of ions implanted into the lateral walls defining each grooves will have a distribution in the lateral wall surfaces. This is because there is an area shadowed by the opening in the groove; the nearer to a corner of the bottom of the groove is a region, the longer the time the reion is shadowed and hence, the smaller the amount of ions implanted. To avoid this ununiformity, the angle of inclination $\theta$ and the angle of rotation $\alpha$ around own axis of the sample substrate 3 are set in such a manner as to correspond to the shape of the groove formed on the main surface of the sample substrate 3. More preferably, the energy of ions to be implanted is also changed depending on the shape of the groove. Signals for controlling the angle of inclination $\theta$ and the angle of rotation $\alpha$ are given from the control box 16.

Figure 2:
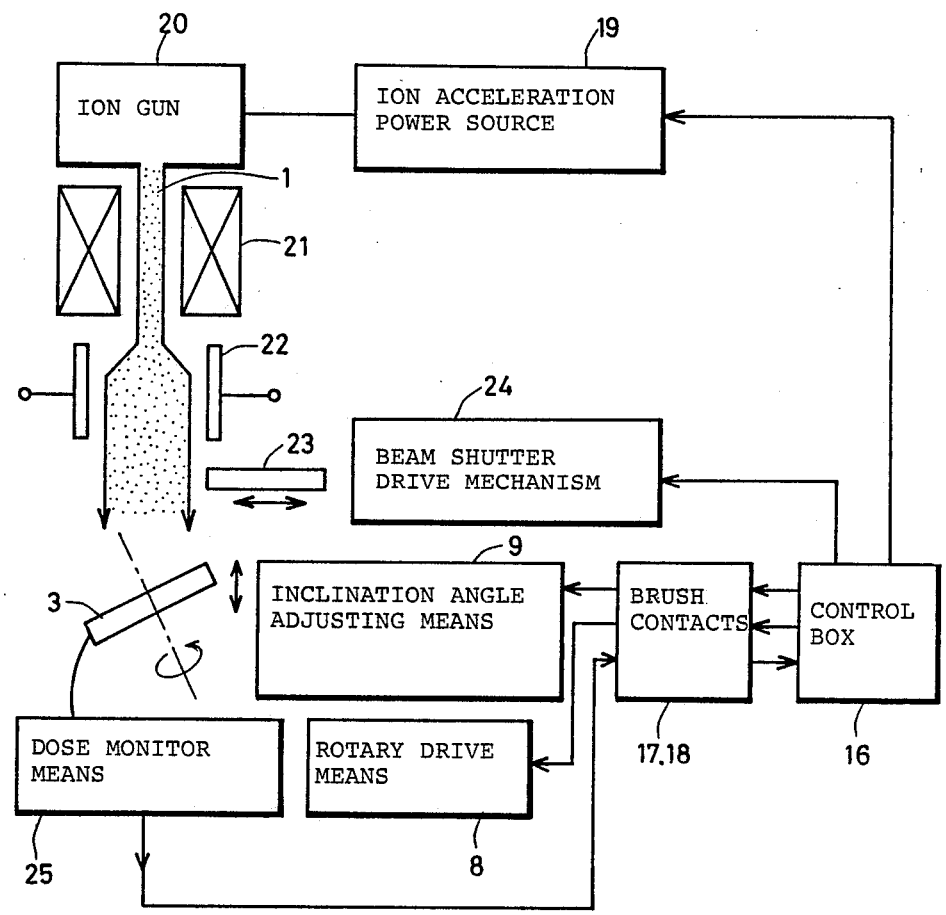
FIG. 2 is a block diagram for a signal control system used when ion implantation is performed using an embodiment of the invention.
Figure 3:
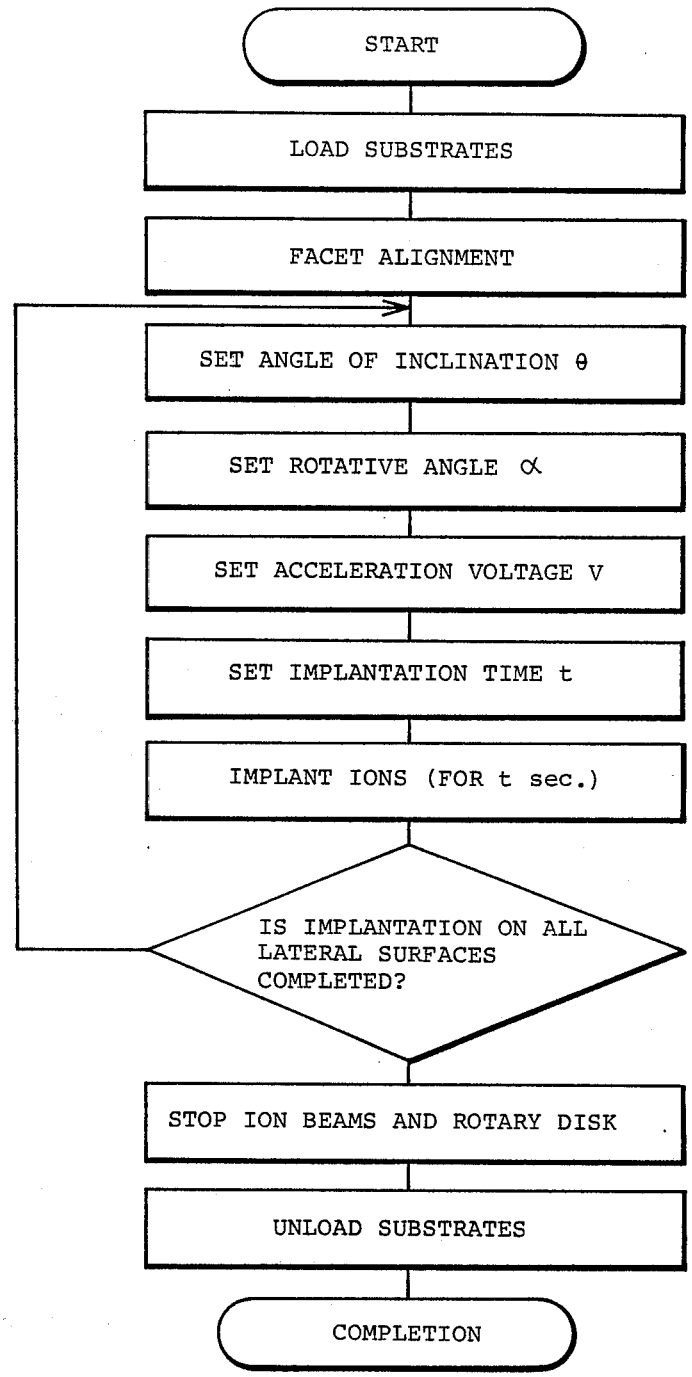
FIG. 3 is a flowchart for actuating the device shown in FIG. 2.

FIG. 2 is a block diagram of a signal control system, and FIG. 3 is a flowchart. Referring to these two figures, a description will be given of what control is performed to implant ions uniformly into each of the lateral walls defining each groove on the sample substrate 3.

First, the sample substrate 3 is mounted on the substrate block 10 and facet alignment is made. Then, the angle of inclination $\theta$ and the rotative angle $\alpha$ with respect to ion beams 1 are set according to the shape of the groove. The control signal for adjusting the angle of inclination 8 is emitted from the control box 16 and transmitted to the inclination angle adjusting means 9 via the brush contacts 17 and 18. The control signal for adjusting the rotative angle $\alpha$ is also emitted from the control box 16 and transmitted to the rotative drive means 8 via the brush contacts 17 and 18.

Further, to optimize the mount of ions for the lateral wall to be irradiated with ion beams, a signal for controlling the ion acceleration voltage V is emitted from the control box 16 and transmitted to an ion acceleration power source 19. As a result, an ion gun 20 irradiates each wall with ion beams having optimum energy. The ion implantation time t is set in consideration of the shape of the groove.

Ion beams 1 emitted from the ion gun 20 travel to the main surface of the sample substrate 3 via a mass separator magnet 21 and deflector 22.

When the amount of ions implanted into the lateral wall being irradiated with ion beams 1 reaches a predetermined value, dose monitor means 25 detects this fact and transmits its signal to the control box 16. Thereupon, the control box 16 sends a signal for actuating a beam shutter 23 to a beam shutter drive mechanism 24. The beam shutter 23 cuts off radiation of ion beams 1 to the sample substrate 3.

In this manner, the same control is performed on each of the lateral walls, and when ion implantation on all the lateral walls defining the groove is completed, the radiation of ion beams is stopped and so is the rotation of the rotary disk 2. Thereupon, the sample substrate 3 is unloaded. In addition, in the flowchart in FIG. 3, the order of setting of conditions is not limited to the one shown; they may be suitably rearranged.

Figure 4:
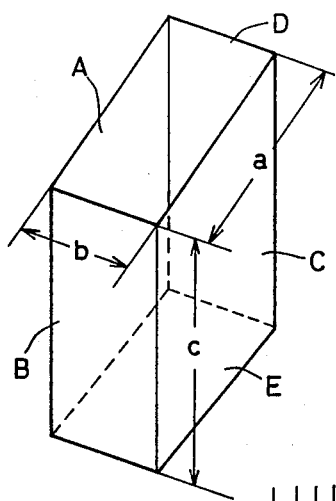
FIG. 4 is a perspective view showing rectangular parallelepipedic groove.
Figure 5:
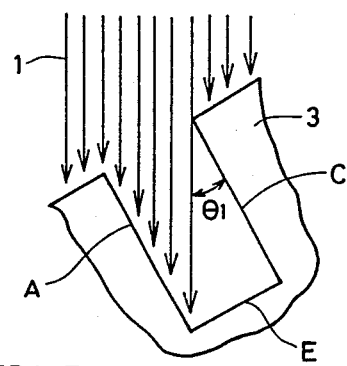
FIGS. 5, 6, 7 and 8 are schematic views showing how the surfaces A, B, C and D defining the lateral walls of each groove are implanted with ions.

A description will now be given of the case where the sample substrate 3 has a rectangular parallelepipedic groove formed on the main surface thereof. FIG. 4 shows the shape of the groove. The groove has an opening of a x b ($\mu m^2$) and a depth of c $\mu m$. The groove is defined by four lateral walls A, B, C and D and a bottom wall E. It is necessary that the four lateral walls A, B, C and D be each implanted with the same amount of ions. First, the support plate 11 is set at such an angle of inclination $\theta_1$ that tan $\theta_1=b/c$. Further, the rotative angle $\alpha$ is set so that the upper edge (the opening in the groove) of the surface A to be irradiated with ion beams 1 is perpendicular to the ion beams. In this state, ion implantation is effected for $t_1$ sec. This state is shown in FIG. 5. In addition, the energy require for this ion implantation is $E_1$.

Figure 6:
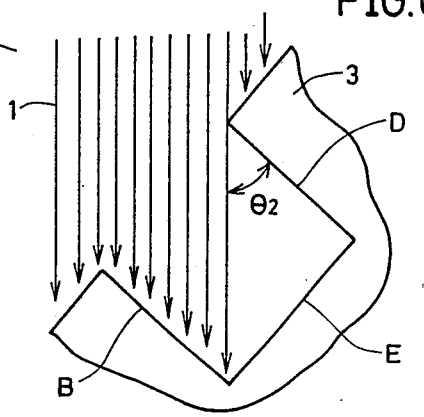

When the amount of ions implanted into the surface A reaches a predetermined value, the sample substrate 3 is rotated through 90 degrees around an axis perpendicular to its main surface so that the upper edge of the surface B is perpendicular to the ion beams 1. And the angle of inclination $\theta_2$ is set so that tan $\theta_2=a/c$. In this state, ion implantation is effected for $t_2$ sec. This state is shown in FIG. 6. In addition, the energy required for this ion implantation is $E_2$. The ratio of $t_1$ to $t_2$ is selected so that $t_1/t_2=\sin \theta_2/\sin \theta_1$.

Figure 7:
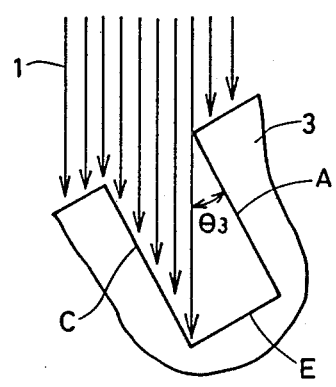
Figure 8:
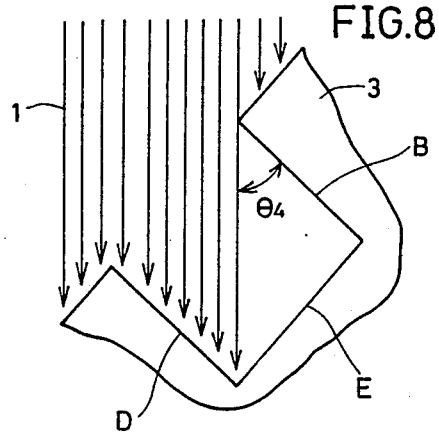
Figure 9:
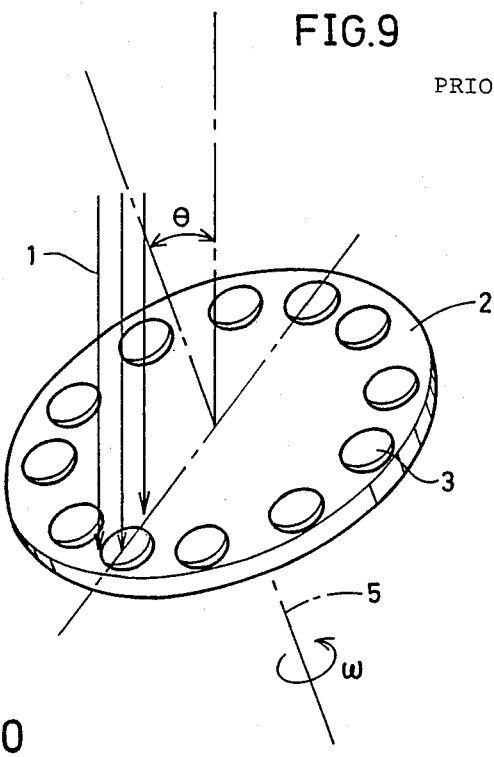
FIG. 9 is a schematic view showing a conventional ion implantation device.
Figure 10:
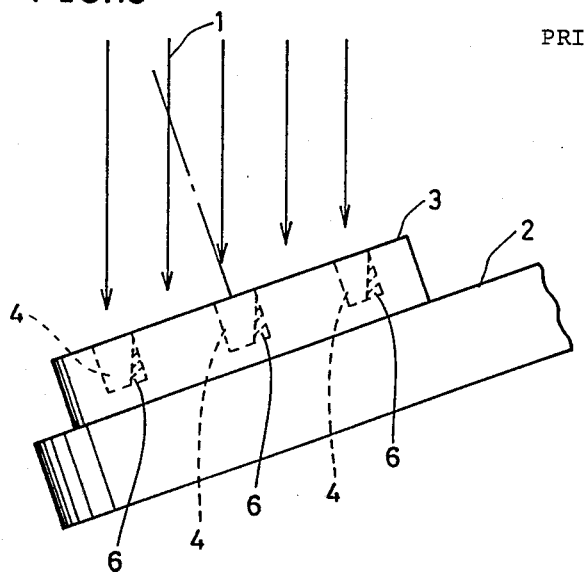
FIG. 10 is an enlarged side view of a semiconductor substrate 3 and a rotary disk 2 shown in FIG. 9.

Following the same procedure, the sample substrate 3 is further rotated through 90 degrees to have its surface C implanted with ions at energy $E_3$ for $t_3$ sec. This state is shown in FIG. 7. The sample substrate 3 is rotated through further 90 degrees to have its surface D implanted with ions at energy $E_4$. This state is shown in FIG. 8.

In this manner, ion implantation for each lateral wall is completed. During said sequence, the rotary disk 2 may continue rotating at a fixed angular velocity $\omega$. If the angle of incidence $\theta$ of ion beams 1 changes, the depth of implantation of ions to be implanted will change. To avoid this, the energy for ion implantation is changed from $E_1$ successively to $E_1$, $E_2$, $E_3$ and finally to $E_4$, as described above. The changes in energy that should be made can be easily calculated from the famous LSS theory advocated by Lindhard et al. (the Lindhard, Scharff and Schiott theory). This LSS theory is described in "Range Concepts and Heavy Ion Ranges," Mat. Fys. Medd. Dan. Vid. Selsk vol. 33, No. 14, pl (1963) and is also explained in Chapter 6 of "VLSI Technology" by S. M. Sze, published by McGraw-Hill.

In the embodiment described above, pulse motors have been used as the rotary drive means 8 and inclination angle adjusting means 9; however, other types of drive means may be used. Further, in the above embodiment, the rotary drive means 8 and inclination angle adjusting means 9 have been used for each substrate holder 7; however, as a modification, a single rotary drive means and a single inclination angle adjusting means may be used to actuate a plurality of substrate holders by incorporating a mechanical transmission means such as belts or gears.

Further, in the embodiment described above, the transmission of signals necessary for the rotary drive means 8 and inclination angle adjusting means 9 has been through the intermediary of the brush electrodes installed on the rotary disk; however, as another example, the transmission of signals may be made by using optical communication means such as photodiodes. Further, solar cells may be used as the power source for the rotary drive means 8 and inclination angle adjusting means 9.

The rotation of the sample substrate 3 is controlled according to the shape of the groove formed on the main surface thereof. In many cases, however, the sample substrate 3 is digitally rotated. Particularly in the case where the groove is rectangular parallelepipedic, the rotation of the sample substate 3 is digitally effected in increments of 90 degrees. In the case where the groove is hexagonal in cross section, the rotation of the sample substrate 3 is digitally effected through an angle of 360 degrees divided by 6. i.e., 60 degrees. In the case where the groove is triangle in cross section, the rotation of the sample substrate 3 is digitally effected through an angle of 360 degrees divided by 3, i.e., 120 degrees.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A substrate support structure for an ion implantation device for supporting a substrate to be implanted with ions, comprising
    a plurality of rotatable substrate holders, each for supporting a sample substrate so that the sample substrates can each be rotated around an axis perpendicular to its main surface and so that the angle of inclination of said main surface with respect to ion beams can be changed;
    rotary drive means responsive to a first control signal for rotatively driving said sample substrate;
    inclination angle adjusting means responsive to a second control signal for changing the angle of inclination of said sample substrates with respect to the ion beam; and
    a rotary disk rotatably installed and supporting said plurality of substrate holders on a common circumference centered at the axis of rotation of the rotary disk.

2. A substrate support structure for an ion implantation device, as set forth in claim 1, wherein transmission of said first and second control signals necessary for said rotary drive means and said inclination angle adjusting means, respectively, is effected through brush electrodes installed in the rotary disk.

3. A substrate support structure for an ion implantation device, as set forth in claim 1, wherein transmission of said first and second control signals necessary for said rotary drive means and said inclination angle adjusting means, respectively, is effected through optical communication means.

4. A substrate support structure for an ion implantation device, as set forth in claim 1, wherein said rotary drive means and said inclination angle adjusting means are powered by a solar cell.

5. A substrate support structure for an ion implantation device, as set forth in claim 1, wherein said rotary drive means is a pulse motor.

6. A substrate support structure for an ion implantation device, as set forth in claim 1, wherein said inclination angle adjusting means is a pulse motor.

7. A substrate support structure for an ion implantation device, as set forth in claim 1, wherein said rotary drive means incrementally rotates the sample substrate.

8. A substrate support structure for an ion implantation device, as set forth in claim 7, wherein the rotation of the sample substrate is incrementally effected through an angle of 360 degrees divided by an integer.

9. A substrate support structure for an ion implantation device, as set forth in claim 1, wherein the energy for ion implantation is changed according to the rotation and inclination of the sample substrate.

10. A substrate support structure for an ion implantation device as set forth in claim 1, wherein there is a fixed relationship between the time intervals for changing the rotative angle of the sample substrate and the angle of inclination of the sample substrate.

* * * * *